United States Patent
Arimitsu et al.

(10) Patent No.: US 10,197,913 B2
(45) Date of Patent: Feb. 5, 2019

(54) PHOTOSENSITIVE RESIN COMPOSITION AND CURED PRODUCT THEREOF

(71) Applicants: Tokyo University of Science Foundation, Tokyo (JP); NIPPON KAYAKU KABUSHIKI KAISHA, Tokyo (JP)

(72) Inventors: Koji Arimitsu, Tokyo (JP); Kiwamu Terada, Saitama (JP)

(73) Assignees: TOKYO UNIVERSITY OF SCIENCE FOUNDATION, Tokyo (JP); NIPPON KAYAKU KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/516,116

(22) PCT Filed: Sep. 29, 2015

(86) PCT No.: PCT/JP2015/077485
§ 371 (c)(1),
(2) Date: Mar. 31, 2017

(87) PCT Pub. No.: WO2016/052493
PCT Pub. Date: Apr. 7, 2016

(65) Prior Publication Data
US 2017/0293225 A1 Oct. 12, 2017

(30) Foreign Application Priority Data
Oct. 1, 2014 (JP) .................. 2014-202947

(51) Int. Cl.
| | |
|---|---|
| G03F 7/16 | (2006.01) |
| G06F 7/20 | (2006.01) |
| G03F 7/32 | (2006.01) |
| G03F 7/38 | (2006.01) |
| G03F 7/004 | (2006.01) |
| G03F 7/038 | (2006.01) |
| G03F 7/20 | (2006.01) |

(52) U.S. Cl.
CPC .......... *G03F 7/0385* (2013.01); *G03F 7/0045* (2013.01); *G03F 7/038* (2013.01); *G03F 7/0382* (2013.01); *G03F 7/162* (2013.01); *G03F 7/168* (2013.01); *G03F 7/2004* (2013.01); *G03F 7/322* (2013.01); *G03F 7/325* (2013.01); *G03F 7/38* (2013.01)

(58) Field of Classification Search
CPC ..... G03F 7/0045; G03F 7/0385; G03F 7/0382
See application file for complete search history.

(56) References Cited

U.S. PATENT DOCUMENTS

| | | |
|---|---|---|
| 5,627,010 A | 5/1997 | Pai et al. |
| 2009/0202942 A1 | 8/2009 | Fukui et al. |

FOREIGN PATENT DOCUMENTS

| | | |
|---|---|---|
| JP | H06-041493 A | 2/1994 |
| JP | H07-053499 A | 2/1995 |
| JP | 2003-344993 A | 12/2003 |
| JP | 2012-159657 A | 8/2012 |
| JP | 2013-95706 A | 5/2013 |
| JP | 2013-181991 A | 9/2013 |
| WO | 2007/144967 A1 | 12/2007 |

OTHER PUBLICATIONS

Koji Arimitsu et al., Applications of a Nonlinear Organic Reaction of Carbamates to Proliferate Aliphatic Amines, "Angew. Chem. Int.", 2000, pp. 39, No. 19.
Cameron et al., "Base Catalysis in Imaging Materials", Design and Synthesis of Novel Light-Sensitive Urethanes as Photoprecursors of Amines, Journal of Organic Chemistry, 1990, pp. 55, 5919-5922.
International Search Report with respect to PCT/JP2015/077485, dated Nov. 2, 2015.
International Preliminary Report on Patentability issued in PCT/JP2015/077485, dated Apr. 4, 2017.

*Primary Examiner* — Cynthia Hamilton
(74) *Attorney, Agent, or Firm* — Greenblum & Bernstein, P.L.C.

(57) ABSTRACT

Provided is a photosensitive resin composition that contains (A) a photobase generator and (B) an alkali-soluble epoxy compound, wherein the photobase generator (A) contains a compound represented by formula (2-1):

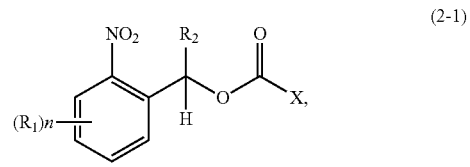

and the alkali-soluble epoxy compound (B) is an epoxy compound obtained by reacting (c) a polybasic acid anhydride with a product of a reaction between (a) an epoxy compound having two or more epoxy groups in the molecule and (b) a compound having one or more hydroxyl groups and one carboxyl group in the molecule.

7 Claims, 4 Drawing Sheets

[Figure 1]
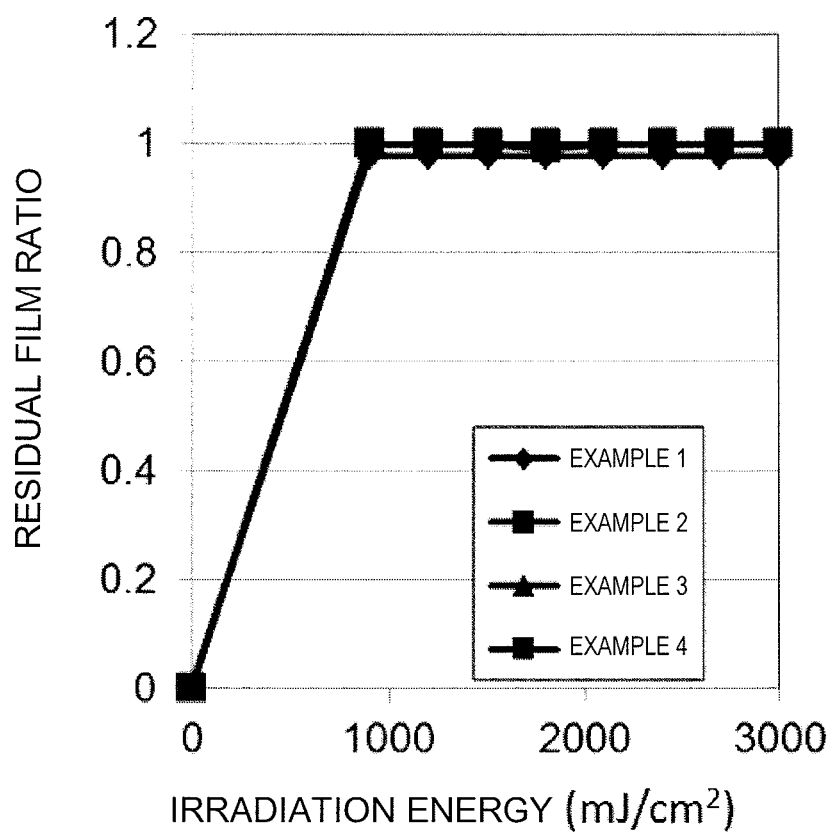

[Figure 2]
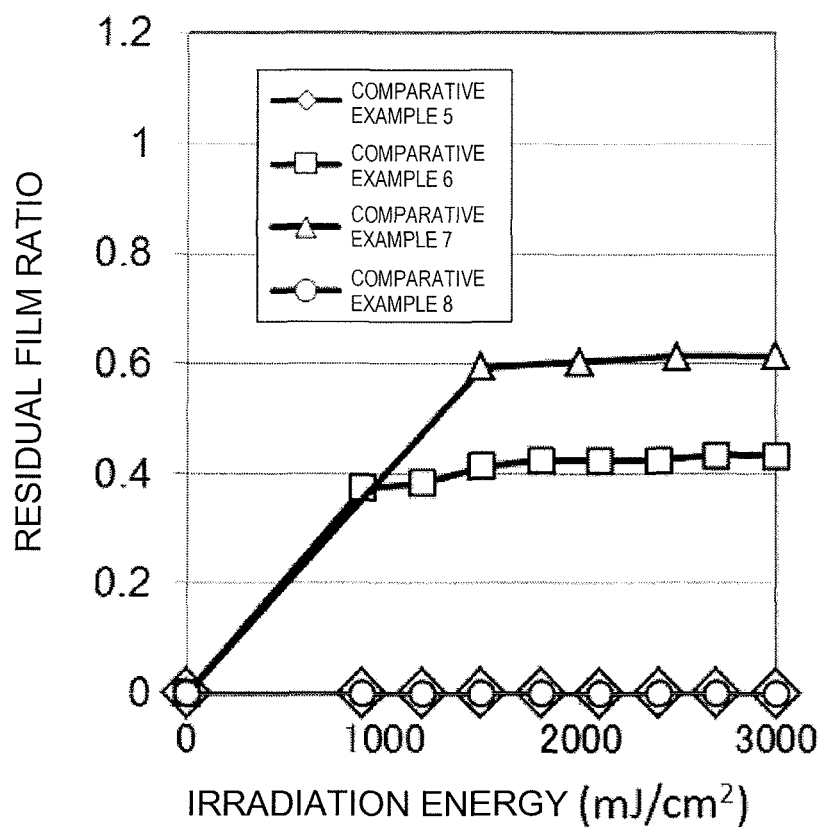

[Figure 3]
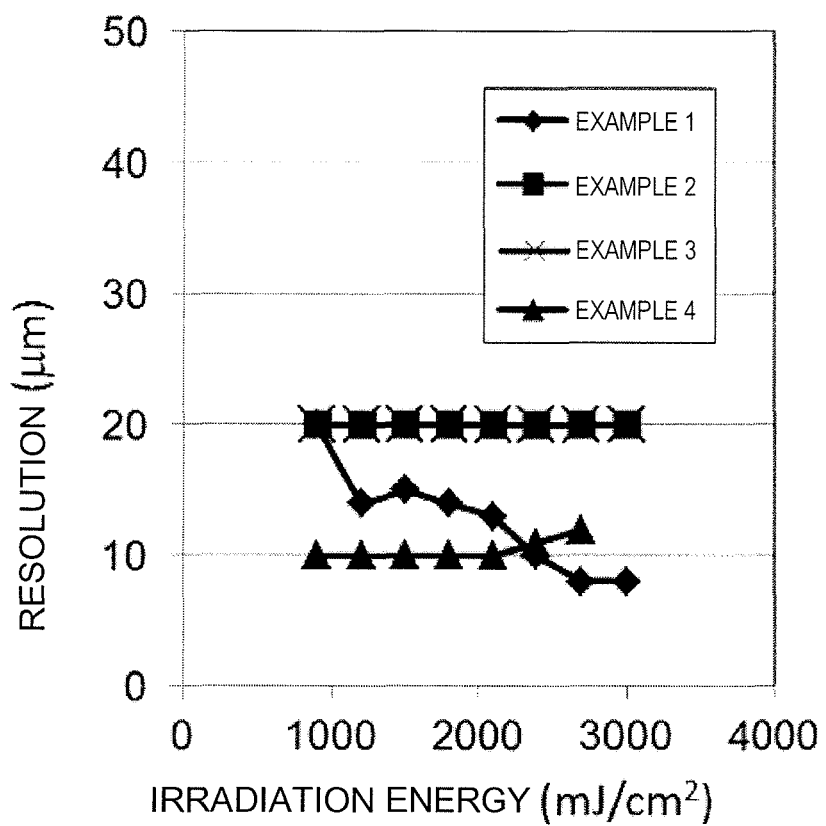

[Figure 4]
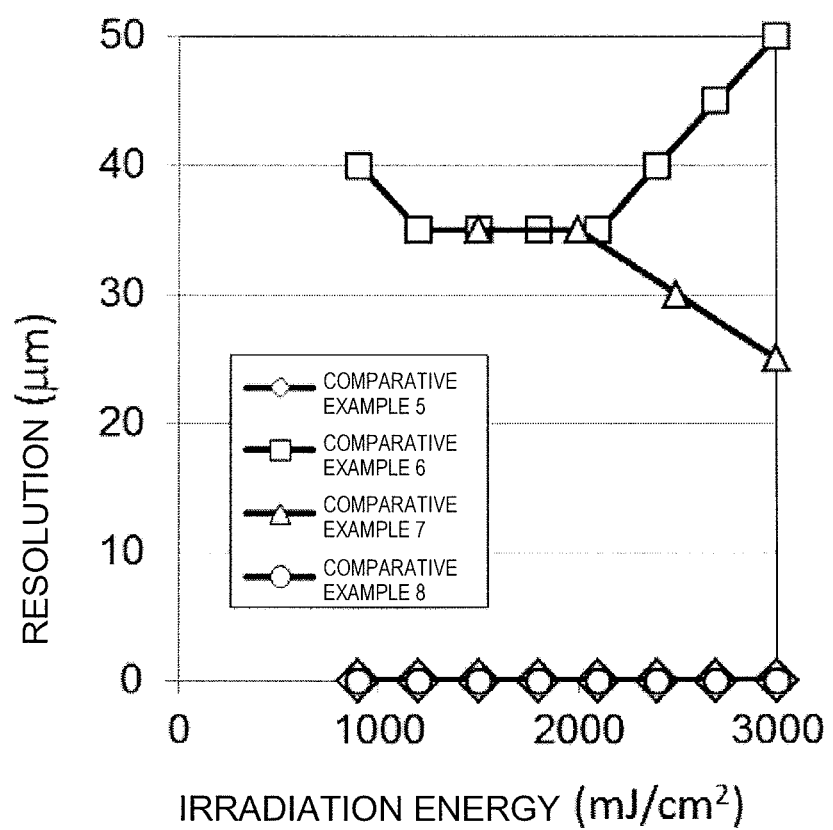

PHOTOSENSITIVE RESIN COMPOSITION AND CURED PRODUCT THEREOF

TECHNICAL FIELD

The present invention relates to a photosensitive resin composition containing a photobase generator configured to generate base by irradiation with activated energy rays.

BACKGROUND ART

Conventionally, photosensitive resin compositions which undergo changes in chemical structure by irradiation with active energy rays such as light, infrared rays, electron beams, or X-rays are used for various applications.

As such a photosensitive resin composition, a chemically amplified resist containing a photoacid generator which generates strong acid by irradiation with active energy rays is, for example, known. In this chemically amplified resist, the strong acid generated by irradiation with active energy rays acts on a resin component as a catalyst to change the solubility in a developer, thereby forming a pattern. Up to present, for the purpose of enhancing the sensitivity and the resolution, various resist materials have been developed, but the combination between the photoacid generator and the resin is limited, and development of a new chemically amplified resist is desired.

The light-curing techniques of monomers and prepolymers by irradiation with active energy rays are roughly classified into three types of the radical type, the cation type, and the anion type. Among these, a technique of polymerizing vinyl monomers by photoirradiation of a photo-radical initiator is most widely developed. Further, a technique of performing cationic polymerization by generating an acid using the action of light and using the acid as a catalyst has been studied.

However, in the case of such radical polymerization type, the polymerization reaction is inhibited by oxygen in air, and therefore a special devisal to block oxygen is necessary. Further, in the case of the cationic polymerization type, it is advantageous in that there is no inhibition by oxygen, but the corrosivity of the strong acid generated from the residual photoacid generator after curing and possible modification of the resin have been pointed out. Therefore, development of a photosensitive resin composition which is free from corrosive materials such as strong acid and allows a reaction to proceed rapidly with high efficiency without inhibition by oxygen in air has been strongly desired.

In such a situation, a photosensitive resin composition containing an anionic photobase generator using base generated by the action of light for polymerization reactions or chemical reactions has been proposed. However, as compared with radical photopolymerization initiators and cationic photoacid generators, anionic photobase generators have disadvantages of having poor photosensitivity and requiring irradiation with strong active energy.

Patent Literature 1 discloses a photosensitive resin composition containing a photobase generator configured to generate base by the action of light, an epoxy resin having a carboxyl group, and a curing agent having a thiol group. A basic amine compound is first generated by irradiating the aforementioned photosensitive resin with light, followed by heat treatment, thereby allowing a reaction of the generated amine compound with an epoxy group to obtain a cured film.

However, in such a photobase generator as used in Patent Literature 1, the amine generated by photoirradiation is monofunctional, and therefore a polyfunctional thiol monomer needs to be used in combination in order to obtain a cured film at a high residual film ratio. The polyfunctional primary thiol monomer is reactive with the epoxy resin even at room temperature, and thus the photosensitive resin composition has a short pot life, which has been a problem.

Further, the photobase generator used in Patent Literature 1 has a phenolic hydroxyl group in the molecule, and therefore the reaction of the epoxy group proceeds by heating also in the sites which are not subjected to photoirradiation. Therefore, in the case of using the photosensitive resin composition as a resist, a cured film is formed also in unexposed portions, and thus it has been difficult to faithfully reproduce a mask pattern.

CITATION LIST

Patent Literature

Patent Literature 1: JP 2013-095706 A

Non Patent Literature

Non Patent Literature 1: Angew. Chem. Int. 2000, 39, No. 19

SUMMARY OF INVENTION

Technical Problem

The present invention has been devised in view of the problems described above, and an object thereof is to provide a photosensitive resin composition which has high sensitivity among the system using a photobase generator and thus is easy to cure, and in which a cured film to be obtained has excellent storage stability in addition to high resolution and high residual film ratio.

Solution to Problem

As a result of diligent studies to solve the aforementioned problems, the inventors have found that a photosensitive resin composition containing both a photobase generator having a specific structure and an alkali-soluble epoxy resin is excellent in sensitivity, resolution, and storage stability, and a cured film is obtained at high residual film ratio by using the resin composition, and thus they have accomplished the present invention.

That is, the present invention relates to:

(1) A photosensitive resin composition containing: (A) a photobase generator; and (B) an alkali-soluble epoxy compound, wherein the photobase generator (A) contains a compound represented by formula (2-1) below:

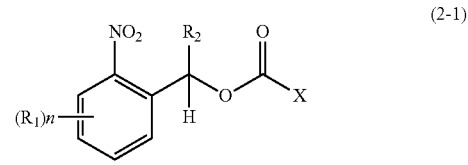

wherein, in formula (2-1), n represents an integer of 0 to 4; $R_1$ represents at least one substituent selected from the group consisting of an alkyl group having 1 to 18 carbon atoms, an alkenyl group having 2 to 18 carbon atoms, an alkynyl group having 2 to 18 carbon atoms, an aryl group having 6 to 12 carbon atoms, an acyl group having 1 to 18 carbon atoms, an aroyl group having 7 to 18 carbon atoms, a nitro group, a cyano group, an alkoxy group having 1 to 18 carbon atoms, an alkylthio group having 1 to 18 carbon atoms, a hydroxyl group, and a halogen atom; $R_2$ represents a hydrogen atom, an alkyl group having 1 to 18 carbon atoms, an alkynyl group having 2 to 18 carbon atoms, an aryl group having 6 to 12 carbon atoms, an acyl group having 1 to 18 carbon atoms, an aroyl group having 7 to 18 carbon atoms, a nitro group, a cyano group, an alkoxy group having 1 to 18 carbon atoms, an alkylthio group having 1 to 18 carbon atoms, a hydroxyl group, or a halogen atom; and X represents an amino group, and the alkali-soluble epoxy compound (B) is an epoxy compound obtained by allowing (c) a polybasic acid anhydride to react with a reaction product of (a) an epoxy compound having at least two epoxy groups in one molecule and (b) a compound having at least one hydroxyl group and one carboxyl group in one molecule;

(2) The photosensitive resin composition according to (1) set forth, wherein X in formula (2-1) is a group represented by formula (3-1) below:

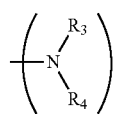

(3-1)

wherein, in formula (3-1), $R_3$ and $R_4$ each independently represent a hydrogen atom, an alkyl group having 1 to 12 carbon atoms, a cycloalkyl group having 5 to 10 carbon atoms, an aryl group having 6 to 14 carbon atoms, or an arylalkyl group having 7 to 15 carbon atoms, or $R_3$ and $R_4$ are bonded to each other to form a nitrogen-containing ring having 3 to 12 constituent atoms;

(3) The photosensitive resin composition according to (1) set forth, wherein the compound represented by formula (2-1) is a compound represented by formula (4-1) or (4-2) below:

wherein, in each of formulas (4-1) and (4-2), $R_1$ independently has the same meaning as in formula (2-1), n independently represents an integer of 0 to 4, and p represents an integer of 1 to 6;

(4) The photosensitive resin composition according to any one of (1) to (3) set forth, wherein the alkali-soluble epoxy compound (B) contains an epoxy compound represented by formula (5-1):

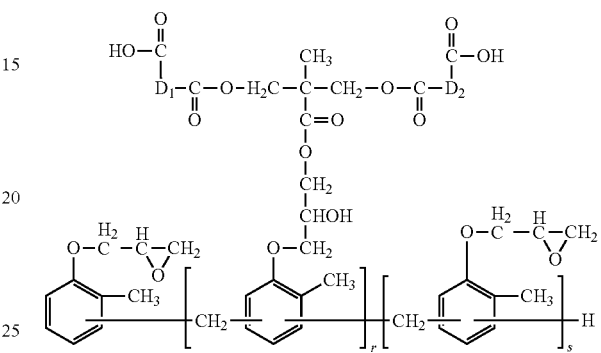

(5-1)

wherein, in formula (5-1), r represents a real number of 1 or more, s represents a real number of 0 or more, provided that the sum of r and s is 30 or less, and D1 and D2 each independently represent any one of divalent bonding groups represented by formulas (6-1) to (6-10) below:

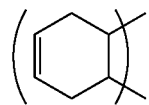

(6-1)

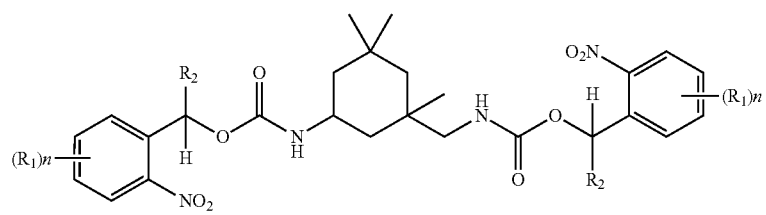

(4-1)

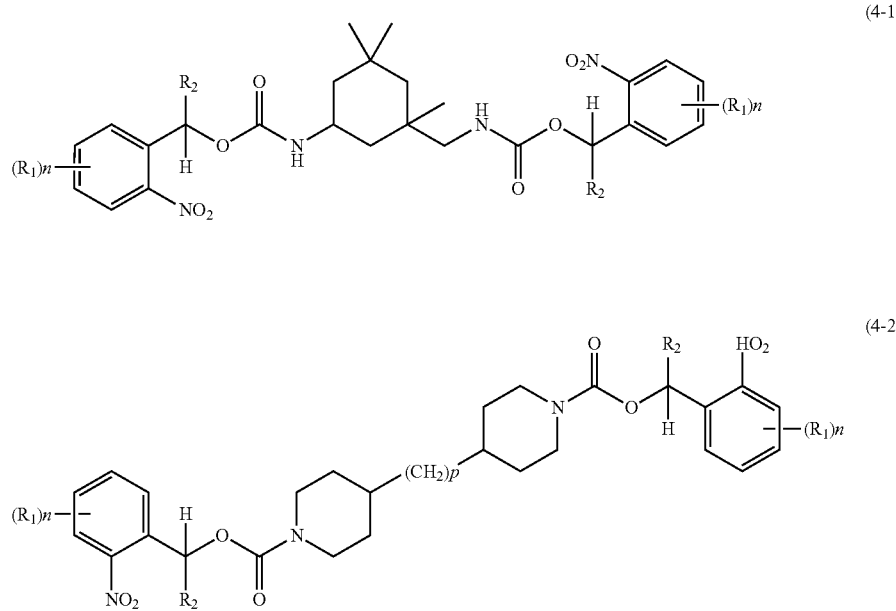

(4-2)

-continued

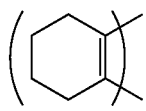  (6-2)

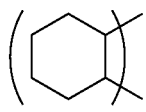  (6-3)

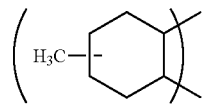  (6-4)

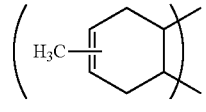  (6-5)

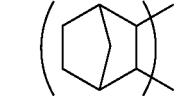  (6-6)

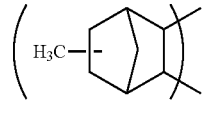  (6-7)

  (6-8)

  (6-9)

(6-10)

(5) The photosensitive resin composition according to any one of (1) to (4) set forth, further containing a compound having at least one urethane bond as (C) a base proliferator;

(6) The photosensitive resin composition according to (5) set forth, wherein the compound having at least one urethane bond is a compound having a base proliferating group represented by formula (7-1) below:

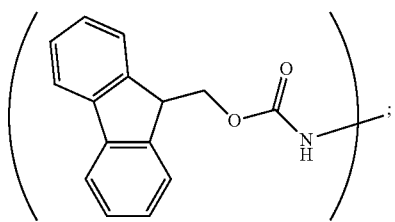  (7-1)

(7) A cured product of the photosensitive resin composition according to any one of (1) to (6) set forth; and (8) A method for forming a pattern, including the steps of: applying the photosensitive resin composition according to any one of (1) to (6) set forth onto a support; drying a photosensitive resin composition layer obtained by the application; exposing the resin composition layer to light in a predetermined pattern after the drying; baking the resin composition layer after the exposure; developing the resin composition layer; and heat-treating the obtained resin pattern to obtain a cured resin pattern.

Advantageous Effects of Invention

The photosensitive resin composition of the present invention is excellent in sensitivity, resolution, and storage stability, and a cured film is obtained at high residual film ratio by using the resin composition.

BRIEF DESCRIPTION OF DRAWINGS

FIG. 1 shows the measurement results of the residual film ratio (the film thickness of a pattern obtained after patterning, when the film thickness before exposure is taken as 1) of the photosensitive resin compositions of Examples 1 to 4 with each exposure amount.

FIG. 2 shows the measurement results of the residual film ratio (the film thickness of a pattern obtained after patterning, when the film thickness before exposure is taken as 1) of the photosensitive resin compositions of Comparative Examples 5 to 8 with each exposure amount.

FIG. 3 shows the measurement results of the resolution (the width of the narrowest pattern line in close contact with a substrate) of the photosensitive resin compositions of Examples 1 to 4 with each exposure amount.

FIG. 4 shows the measurement results of the resolution (the width of the narrowest pattern line in close contact with a substrate) of the photosensitive resin compositions of Comparative Examples 5 to 8 with each exposure amount.

DESCRIPTION OF EMBODIMENTS

Hereinafter, the present invention will be described in detail.

An aspect of the present invention is a photosensitive resin composition containing: (A) a photobase generator (hereinafter, simply referred to also as "component (A)"); and alkali-soluble epoxy compound (B) (hereinafter, simply referred to also as "component (B)"), wherein the component (A) contains a compound represented by formula (2-1) above, and the component (B) is an epoxy compound obtained by allowing (c) a polybasic acid anhydride to react with a reaction product of (a) an epoxy compound having at least two epoxy groups in one molecule and (b) a compound having at least one hydroxyl group and one carboxyl group in one molecule.

The photosensitive resin composition of the present invention contains at least one of the component (A) represented by formula (2-1) below. The component (A) is a compound capable of generating a monofunctional amine or a polyfunctional amine as base by irradiation with active energy rays.

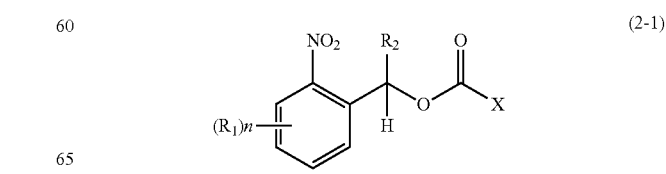  (2-1)

In formula (2-1), n generally represents an integer of 0 to 4, preferably an integer of 1 to 2, more preferably 2. Further, in the case where n is 2, the substitution position of $R_1$ is preferably the 4-position and the 5-position when the binding position to —$CHR_2$— on the benzene ring specified in formula (2-1) is the 1-position, and the binding position to —$NO_2$ is the 2-position.

In formula (2-1), $R_1$ represents at least one substituent selected from the group consisting of an alkyl group having 1 to 18 carbon atoms, an alkenyl group having 2 to 18 carbon atoms, an alkynyl group having 2 to 18 carbon atoms, an aryl group having 6 to 12 carbon atoms, an acyl group having 1 to 18 carbon atoms, an aroyl group having 7 to 18 carbon atoms, a nitro group, a cyano group, an alkoxy group having 1 to 18 carbon atoms, an alkylthio group having 1 to 18 carbon atoms, a hydroxyl group, and a halogen atom, and when a plurality of substituents $R_1$ are present, they may be different from each other.

Examples of the alkyl group having 1 to 18 carbon atoms represented by $R_1$ in formula (2-1) include a methyl group, an ethyl group, a n-propyl group, an isopropyl group, a n-butyl group, an iso-butyl group, a sec-butyl group, a t-butyl group, a n-pentyl group, a n-hexyl group, a n-heptyl group, a n-octyl group, a n-nonyl group, a n-decyl group, a n-undecyl group, and a n-dodecyl group, and it is preferably an alkyl group having 2 to 6 carbon atoms.

Examples of the alkenyl group having 2 to 18 carbon atoms represented by $R_1$ in formula (2-1) include a vinyl group, a propenyl group, a 1-butenyl group, an iso-butenyl group, a 1-pentenyl group, a 2-pentenyl group, a 2-methyl-1-butenyl group, a 3-methyl-1-butenyl group, a 2-methyl-2-butenyl group, a 2,2-dicyanovinyl group, a 2-cyano-2-methylcarboxyvinyl group, and a 2-cyano-2-methyl sulfone vinyl group.

Examples of the alkynyl group having 2 to 18 carbon atoms represented by $R_1$ in formula (2-1) include an ethynyl group, a 1-propynyl group, and a 1-butynyl group.

Examples of the aryl group having 6 to 12 carbon atoms represented by $R_1$ in formula (2-1) include a phenyl group, a naphthyl group, and a tolyl group, and it is preferably an aryl group having 6 to 10 carbon atoms.

Examples of the acyl group having 1 to 18 carbon atoms represented by $R_1$ in formula (2-1) include a formyl group, an acetyl group, an ethylcarbonyl group, a n-propylcarbonyl group, an iso-propylcarbonyl group, a n-butylcarbonyl group, a n-pentylcarbonyl group, an iso-pentylcarbonyl group, a neo-pentylcarbonyl group, a 2-methylbutylcarbonyl group, and a nitrobenzylcarbonyl group.

Examples of the aroyl group having 7 to 18 carbon atoms represented by $R_1$ in formula (2-1) include a benzoyl group, a toluoyl group, a naphthoyl group, and a phthaloyl group.

Examples of the alkoxy group having 1 to 18 carbon atoms represented by $R_1$ in formula (2-1) include a methoxy group, an ethoxy group, a n-propoxy group, an iso-propoxy group, a n-butoxy group, an iso-butoxy group, a sec-butoxy group, a t-butoxy group, a n-pentoxy group, an iso-pentoxy group, a neo-pentoxy group, a n-hexyloxy group, and a n-dodecyloxy group.

Examples of the alkylthio group having 1 to 18 carbon atoms represented by $R_1$ in formula (2-1) include a methylthio group, an ethylthio group, a n-propylthio group, an iso-propylthio group, a n-butylthio group, an iso-butylthio group, a sec-butylthio group, a t-butylthio group, a n-pentylthio group, an iso-pentylthio group, a 2-methyl butylthio group, a 1-methyl butylthio group, a neo-pentylthio group, a 1,2-dimethyl propylthio group, and a 1,1-dimethyl propylthio group.

Examples of the halogen atom represented by $R_1$ in formula (2-1) include a fluorine atom, a chlorine atom, a bromine atom, and an iodine atom.

$R_1$ in formula (2-1) is preferably an alkoxy group having 1 to 18 carbon atoms, more preferably an alkoxy group having 1 to 10 carbon atoms, further preferably an alkoxy group having 1 to 4 carbon atoms, particularly preferably a methoxy group. When a plurality of substituents $R_1$ are present, it is preferable that at least one substituent $R_1$ be an alkoxyl group, and it is more preferable that all of the substituents $R_1$ are alkoxyl groups.

In formula (2-1), $R_2$ is a hydrogen atom, an alkyl group having 1 to 18 carbon atoms, an alkynyl group having 2 to 18 carbon atoms, an aryl group having 6 to 12 carbon atoms, an acyl group having 1 to 18 carbon atoms, an aroyl group having 7 to 18 carbon atoms, a nitro group, a cyano group, an alkoxy group having 1 to 18 carbon atoms, an alkylthio group having 1 to 18 carbon atoms, a hydroxyl group, or a halogen atom.

Examples of the alkyl group having 1 to 18 carbon atoms, the alkynyl group having 2 to 18 carbon atoms, the aryl group having 6 to 12 carbon atoms, the acyl group having 1 to 18 carbon atoms, the aroyl group having 7 to 18 carbon atoms, the alkoxy group having 1 to 18 carbon atoms, the alkylthio group having 1 to 18 carbon atoms, and the halogen atom which are represented by $R_2$ in formula (2-1) are the same as the examples of the alkyl group having 1 to 18 carbon atoms, the alkynyl group having 2 to 18 carbon atoms, the aryl group having 6 to 12 carbon atoms, the acyl group having 1 to 18 carbon atoms, the aroyl group having 7 to 18 carbon atoms, the alkoxy group having 1 to 18 carbon atoms, the alkylthio group having 1 to 18 carbon atoms, and the halogen atom which are represented by $R_1$ in formula (2-1).

$R_2$ in formula (2-1) is preferably a hydrogen atom or an alkyl group having 1 to 18 carbon atoms, more preferably a hydrogen atom or an alkyl group having 1 to 10 carbon atoms, further preferably a hydrogen atom or an alkyl group having 1 to 4 carbon atoms, particularly preferably a hydrogen atom.

In formula (2-1), X represents an amino group.

The amino group represented by X in formula (2-1) may be any one of a substituted amino group and an unsubstituted amino group ($NH_2$ group), and the substituted amino group may be any one of a monosubstituted amino group and a disubstituted amino group.

X in formula (2-1) is preferably an amino group represented by formula (3-1) below.

(3-1)

In formula (3-1), $R_3$ and $R_4$ each independently represent a hydrogen atom, an alkyl group having 1 to 18 carbon atoms, a cycloalkyl group having 5 to 10 carbon atoms, an aryl group having 6 to 12 carbon atoms, or an arylalkyl group having 7 to 15 carbon atoms, or $R_3$ and $R_4$ may be bonded to each other to form a nitrogen-containing ring having 3 to 12 constituent atoms. When $R_3$ and $R_4$ are not bonded to each other and thus do not form a nitrogen-containing ring, $R_3$ and $R_4$ each may contain the residue in which the substituent X is eliminated from the compound represented by formula (2-1) above.

Examples of the alkyl group having 1 to 18 carbon atoms represented by $R_3$ and $R_4$ in formula (3-1) are the same as the examples of the alkyl group having 1 to 18 carbon atoms represented by $R_1$ in formula (2-1), and an alkyl group having 2 to 6 carbon atoms is preferable.

The alkyl group having 1 to 18 carbon atoms represented by $R_3$ and $R_4$ in formula (3-1) may have a substituent selected from the group consisting of an amino group, an alkoxy group, an alkoxycarbonyl group, an acyl group, an acyloxy group, and a hydroxy group.

Examples of the amino group which may be contained as a substituent in the alkyl group having 1 to 18 carbon atoms represented by $R_3$ and $R_4$ in formula (3-1) include an amino group, an alkyl-substituted amino group such as a mono- or di-methylamino group, a mono- or di-ethylamino group and a mono- or di-(n-propyl)amino group, an aromatic-substituted amino group such as a mono- or di-phenylamino group and a mono- or di-naphthylamino group, an amino group having one alkyl group and one aromatic residue as substituents such as a monoalkylmonophenylamino group, or a benzylamino group, an acetylamino group and a phenylacetylamino group.

Examples of the alkoxy group which may be contained as a substituent in the alkyl group having 1 to 12 carbon atoms represented by $R_3$ and $R_4$ in formula (2-1) include a methoxy group, an ethoxy group, a n-propoxy group, an isopropoxy group, a n-butoxy group, an isobutoxy group, a sec-butoxy group, and a t-butoxy group.

Examples of the alkoxycarbonyl group which may be contained as a substituent in the alkyl group having 1 to 18 carbon atoms represented by $R_3$ and $R_4$ in formula (3-1) include a methoxycarbonyl group, an ethoxycarbonyl group, a n-propoxycarbonyl group, an isopropoxycarbonyl group, a n-butoxycarbonyl group, an isobutoxycarbonyl group, a sec-butoxycarbonyl group, a t-butoxycarbonyl group, a n-pentoxycarbonyl group, a n-hexyloxycarbonyl group, a n-heptyloxycarbonyl group, a n-nonyloxycarbonyl group, and a n-decyloxycarbonyl group.

Examples of the acyl group which may be contained as a substituent in the alkyl group having 1 to 18 carbon atoms represented by $R_3$ and $R_4$ in formula (3-1) include a alkylcarbonyl group having 1 to 10 carbon atoms and an arylcarbonyl group. An alkylcarbonyl group having 1 to 4 carbon atoms is preferable, and specific examples thereof include an acetyl group, a propionyl group, a trifluoromethylcarbonyl group, a pentafluoroethylcarbonyl group, a benzoyl group, and a naphthoyl group.

Examples of the acyloxy group which may be contained as a substituent in the alkyl group having 1 to 18 carbon atoms represented by $R_3$ and $R_4$ in formula (3-1) include an acyloxy group in which the acyl group which may be contained as a substituent in the alkyl group having 1 to 12 carbon atoms represented by $R_3$ and $R_4$ in formula (2-1) is bonded to an oxygen atom.

Examples of the cycloalkyl group having 5 to 10 carbon atoms represented by $R_3$ and $R_4$ in formula (3-1) include a cyclopentyl group, a cyclohexyl group, a cycloheptyl group, and a cyclooctyl group, in which a cycloalkyl group having 6 to 8 carbon atoms is preferable.

The cycloalkyl group having 5 to 10 carbon atoms represented by $R_3$ and $R_4$ in formula (3-1) may have a substituent selected from the group consisting of an amino group, an alkoxy group, an alkoxycarbonyl group, an acyl group, an acyloxy group, and a hydroxy group, and examples of the amino group, the alkoxy group, the alkoxycarbonyl group, the acyl group, and the acyloxy group which may be contained therein as a substituent are the same as the examples of the amino group, the alkoxy group, the alkoxycarbonyl group, the acyl group, and the acyloxy group which may be contained as a substituent in the alkyl group having 1 to 18 carbon atoms represented by $R_3$ and $R_4$ in formula (2-1).

Examples of the aryl group having 6 to 12 carbon atoms represented by $R_3$ and $R_4$ in formula (3-1) are the same as the examples of the aryl group having 6 to 12 carbon atoms represented by $R_1$ in formula (2-1). An aryl group having 6 to 10 carbon atoms is preferable.

The aryl group having 6 to 12 carbon atoms represented by $R_3$ and $R_4$ in formula (3-1) may have a substituent selected from the group consisting of an amino group, an alkoxy group, an alkoxycarbonyl group, an acyl group, an acyloxy group, and a hydroxy group, and examples of the amino group, the alkoxy group, the alkoxycarbonyl group, the acyl group, and the acyloxy group which may be contained therein as a substituent are the same as the examples of the amino group, the alkoxy group, the alkoxycarbonyl group, the acyl group, and the acyloxy group which may be contained as a substituent in the alkyl group having 1 to 18 carbon atoms represented by $R_3$ and $R_4$ in formula (2-1).

The arylalkyl group having 7 to 15 carbon atoms represented by $R_3$ and $R_4$ in formula (3-1) is a substituent having 7 to 15 carbon atoms in which a hydrogen atom on an alkyl group is substituted with an aryl group, and is preferably an arylalkyl group having 7 to 11 carbon atoms. Specific examples of the alkyl group and the aryl group are the same as the examples of the alkyl group having 1 to 18 carbon atoms and the aryl group having 6 to 12 carbon atoms which are represented by $R_1$ in formula (2-1).

The arylalkyl group having 7 to 15 carbon atoms represented by $R_3$ and $R_4$ in formula (3-1) may have a substituent selected from the group consisting of an amino group, an alkoxy group, an alkoxycarbonyl group, an acyl group, an acyloxy group, and a hydroxy group, and examples of the amino group, the alkoxy group, the alkoxycarbonyl group, the acyl group, and the acyloxy group which may be contained therein as a substituent are the same as the examples of the amino group, the alkoxy group, the alkoxycarbonyl group, the acyl group, and the acyloxy group which may be contained as a substituent in the alkyl group having 1 to 18 carbon atoms represented by $R_3$ and $R_4$ in formula (2-1).

$R_3$ and $R_4$ in formula (3-1) may be bonded to each other to form a nitrogen-containing ring. The number of atoms constituting the nitrogen-containing ring is generally 3 to 12, preferably 5 to 8, including nitrogen atoms. Further, the atoms constituting the nitrogen-containing ring may contain a plurality of heteroatoms (such as nitrogen atoms, oxygen atoms, and sulfur atoms).

Further, also preferably, X in formula (2-1) is a substituent represented by formula (3-2) below.

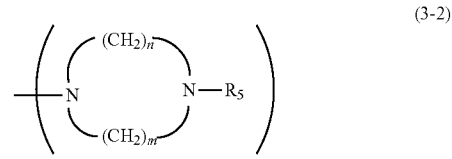

(3-2)

In formula (3-2), n and m each independently represent an integer of 1 to 6, preferably an integer of 2 to 4. Further, n+m is preferably 4 to 12, more preferably 4 to 8.

In formula (3-2), $R_5$ represents a hydrogen atom, an alkyl group having 1 to 18 carbon atoms, an alkoxy group having 1 to 18 carbon atoms, a cycloalkyl group having 5 to 10 carbon atoms, a cycloalkyloxy group having 5 to 10 carbon atoms, an aryl group having 6 to 12 carbon atoms, an aryloxy group having 6 to 12 carbon atoms, an arylalkyl group having 7 to 15 carbon atoms, an arylalkoxy group having 7 to 15 carbon atoms, or an acyl group having 1 to 18 carbon atoms, and may contain the residue in which the substituent X is eliminated from the compound represented by formula (2-1) above.

Examples of the alkyl group having 1 to 18 carbon atoms, the alkoxy group having 1 to 18 carbon atoms, the aryl group having 6 to 12 carbon atoms, and the acyl group having 1 to 18 carbon atoms which are represented by $R_5$ in formula (3-2) are the same as the examples of the alkyl group having 1 to 18 carbon atoms, the alkoxy group having 1 to 18 carbon atoms, the aryl group having 6 to 12 carbon atoms, and the acyl group having 1 to 18 carbon atoms which are represented by $R_1$ in formula (2-1).

Examples of the cycloalkyl group having 5 to 10 carbon atoms and the arylalkyl group having 7 to 15 carbon atoms which are represented by $R_5$ in formula (3-2) are the same as the examples of the cycloalkyl group having 5 to 10 carbon atoms and the arylalkyl group having 7 to 15 carbon atoms which are represented by $R_3$ and $R_4$ in formula (2-1).

The cycloalkyloxy group having 5 to 10 carbon atoms represented by $R_5$ in formula (3-2) is a substituent having 5 to 10 carbon atoms in which a cycloalkyl group is bonded to an oxygen atom, and specific examples of the cycloalkyl group are the same as the examples of the cycloalkyl group having 5 to 10 carbon atoms represented by $R_3$ and $R_4$ in formula (2-1).

The aryloxy group having 6 to 12 carbon atoms represented by $R_5$ in formula (3-2) is a substituent having 6 to 12 carbon atoms in which an aryl group is bonded to an oxygen atom, and specific examples of the aryl group are the same as the examples of the aryl group having 6 to 12 carbon atoms represented by $R_1$ in formula (2-1).

The arylalkoxy group having 7 to 15 carbon atoms represented by $R_5$ in formula (3-2) is a substituent having 7 to 15 carbon atoms in which a hydrogen atom on an alkoxy group is substituted with an aryl group, and specific examples of the alkoxy group and the aryl group are respectively the same as the examples of the alkoxy group having 1 to 18 carbon atoms and the aryl group having 6 to 12 carbon atoms which are represented by $R_1$ in formula (2-1).

The component (A) contained in the photosensitive resin composition of the present invention is particularly preferably a compound represented by formula (4-1) or (4-2) below.

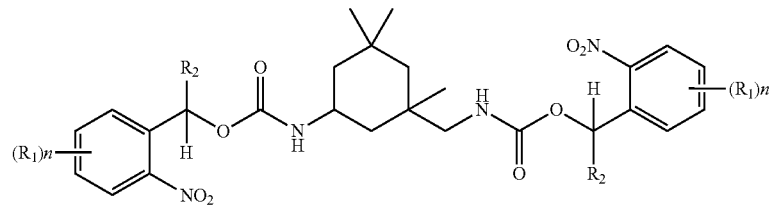

(4-1)

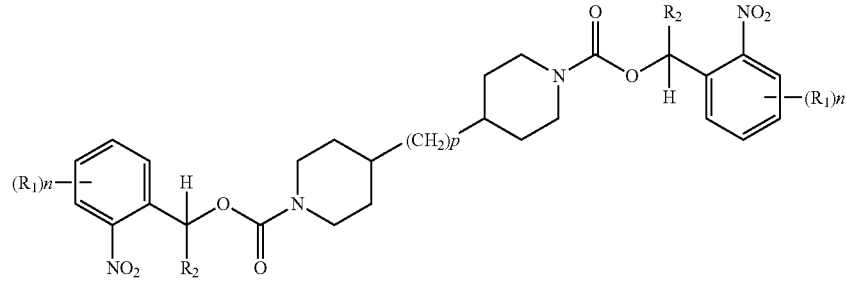

(4-2)

In each of formulas (4-1) and (4-2), $R_1$ independently has the same meaning as $R_1$ in formula (2-1). Preferably, $R_1$ in each of formulas (4-1) and (4-2) independently represents an alkoxy group having 1 to 18 carbon atoms, more preferably, $R_1$ in both formulas represents the same alkoxy group having 1 to 18 carbon atoms, further preferably, $R_1$ in both formulas represents the same alkoxy group having 1 to 4 carbon atoms, particularly preferably, $R_1$ in both formulas represents a methoxy group.

In each of formulas (4-1) and (4-2), $R_2$ independently has the same meaning as $R_2$ in formula (2-1). $R_2$ in formulas (4-1) and (4-2) is preferably a hydrogen atom.

In each of formulas (4-1) and (4-2), n independently represents an integer of 0 to 4, preferably an integer of 1 to 2, more preferably 2, and p represents an integer of 1 to 6, preferably an integer of 2 to 4, more preferably 3.

Specific examples of the compound represented by formula (2-1) above which is contained in the component (A) are shown in formulas (8-1) to (8-6) below, but the present invention is not limited to these examples.

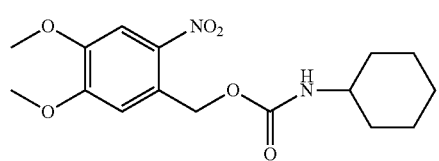 (8-1)

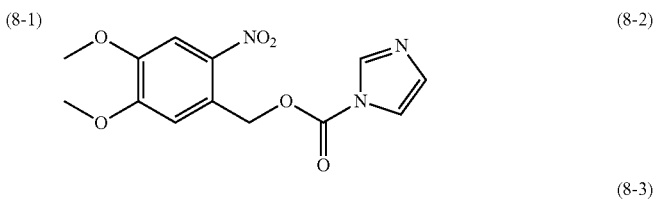 (8-2)

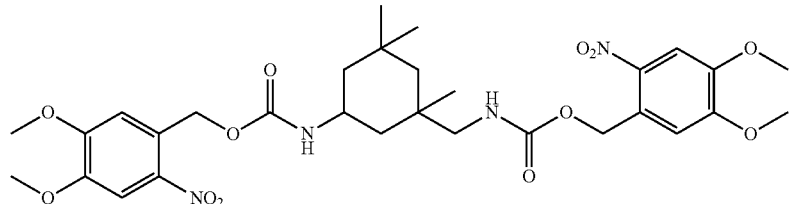 (8-3)

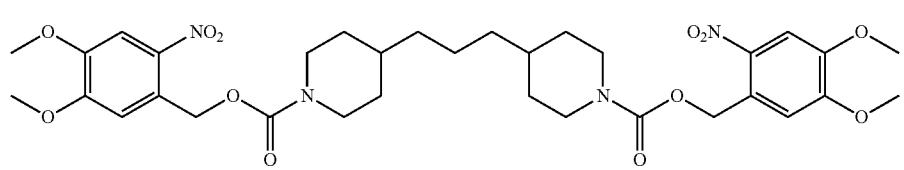 (8-4)

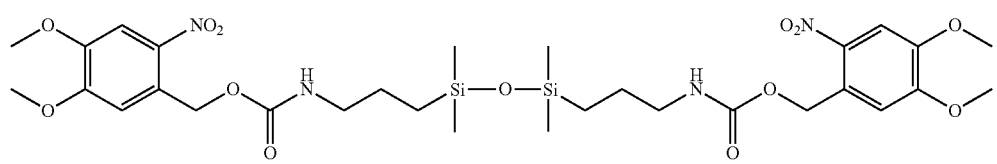 (8-5)

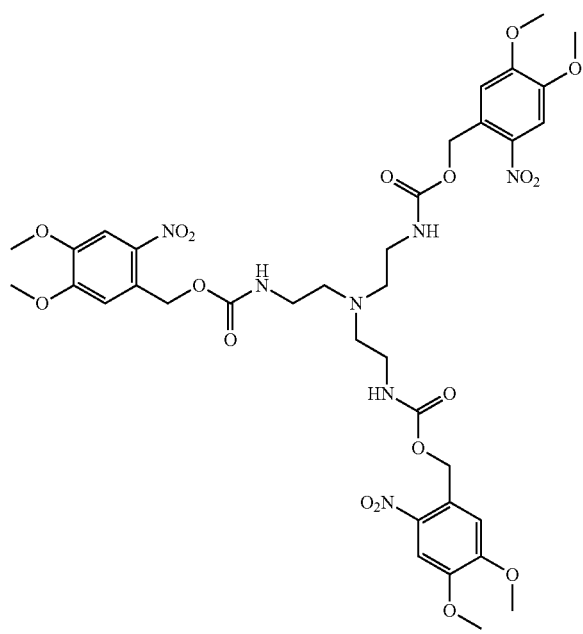 (8-6)

The component (B) contained in the photosensitive resin composition of the present invention is an epoxy compound obtained by allowing (c) a polybasic acid anhydride (hereinafter, referred to simply as "raw material compound (c)") to react with a reaction product of (a) an epoxy compound having at least two epoxy groups in one molecule (hereinafter, referred to simply as "raw material compound (a)") and (b) a compound having at least one hydroxyl group and one carboxyl group in one molecule (hereinafter, referred to simply as "raw material compound (b)").

The raw material compound (a) is not specifically limited as long as it is an epoxy compound having at least two epoxy groups in one molecule, but examples thereof include novolac epoxy resins, bisphenol epoxy resins, trisphenol methane epoxy resins, tris(2,3-epoxypropyl)isocyanurate, biphenyl diglycidyl ether, alicyclic epoxy resins, and copolymerized epoxy resins.

A novolac epoxy resin can be obtained, for example, by a known method of allowing epihalohydrins such as epichlorohydrin and epibromohydrin to react with novolaks obtained by a reaction of phenols such as phenol, cresol, halide phenol, and alkyl phenol with aldehydes such as formaldehyde and acetaldehyde in the presence of an acidic catalyst, but a commercially available product also may be used therefor as it is. Specific examples of the commercially available product include EOCN-103, EOCN-1045, EOCN-102, EOCN-1027, EOCN-4400H, EPPN-201, and BREN-S (which are product names, manufactured by Nippon Kayaku Co., Ltd.), DEN-431 and DEN-439 (which are product names, manufactured by Dow Chemical Company), N-730, N-770, N-865, N-665, N-673, and VH-4150 (which are product names, manufactured by DIC Corporation), and YDCN-700-3, YDCN-700-5, YDCN-700-7, and YDCN-700-10 (which are product names, manufactured by NIPPON STEEL & SUMIKIN CHEMICAL CO., LTD.).

A bisphenol epoxy resin can be obtained, for example, by a known method of allowing epihalohydrins such as epichlorohydrin and epibromohydrin to react with bisphenols such as bisphenol A, bisphenol F, bisphenol S, and tetrabrom bisphenol A or a known method of allowing epihalohydrins such as epichlorohydrin and epibromohydrin to react with a condensate of diglycidyl ether of bisphenols such as bisphenol A and bisphenol F and the aforementioned bisphenols, but a commercially available product also may be used therefor as it is. Specific examples of the commercially available product include jER1004, jER1002, jER4002, and jER4004 (which are product names, manufactured by Japan Epoxy Resins Co., Ltd.).

A trisphenol methane epoxy resin can be obtained, for example, by a known method of allowing epihalohydrins such as epichlorohydrin and epibromohydrin to react with tris(hydroxy)arylmethanes such as trisphenol methane and triscresol methane, but a commercially available product also may be used therefor as it is. Specific examples of the commercially available product include EPPN-501, EPPN-501HY, and EPPN-502 (which are product names, manufactured by Nippon Kayaku Co., Ltd.).

Examples of the alicyclic epoxy resins include CELLOXIDE 2021 and EHPE3150 (which are product names, DAICEL CHEMICAL INDUSTRIES, LTD.), E-1031S (which is a product name, manufactured by Japan Epoxy Resins Co., Ltd.), and EPB-13 and EPB-27 (which are product names, manufactured by Nippon Soda Co., Ltd.).

Examples of the copolymerized epoxy resins include CP-50M and CP-50S (which are product names of copolymers of glycidyl methacrylate, styrene, and methylstyrene, manufactured by NOF CORPORATION), and copolymers of glycidyl methacrylate, cyclohexyl maleimide and the like.

Among these, cresol novolac epoxy resins are preferable as the raw material compound (a) to be used in the present invention.

Examples of the raw material compound (b) include polyhydroxy monocarboxylic acids such as dimethylolpropionic acid, dimethylolacetic acid, dimethylolbutyric acid, dimethylolvaleric acid, and dimethylolcaproic acid, and monohydroxy monocarboxylic acids such as hydroxypivalic acid and p-hydroxybenzoic acid. Two or more of these may be used in combination.

Among these, dimethylolpropionic acid is preferable as the raw material compound (b) to be used in the present invention.

In the reaction between the raw material compound (a) and the raw material compound (b), it is preferable to use the carboxylic acid in the raw material compound (b) in an amount of 0.01 to 0.5 mol, and it is more preferable to use the carboxylic acid in an amount of 0.1 to 0.3 mol, with respect to 1 mol of the epoxy group in the raw material compound (a). The reaction temperature is generally 60 to 150° C., and the reaction time is generally 5 to 30 hours.

It should be noted that the reaction product of the raw material compound (a) and the raw material compound (b) will be hereinafter referred to as "intermediate (ab)".

Examples of the raw material compound (c) include a compound represented by the following formula. Two or more of these may be used in combination.

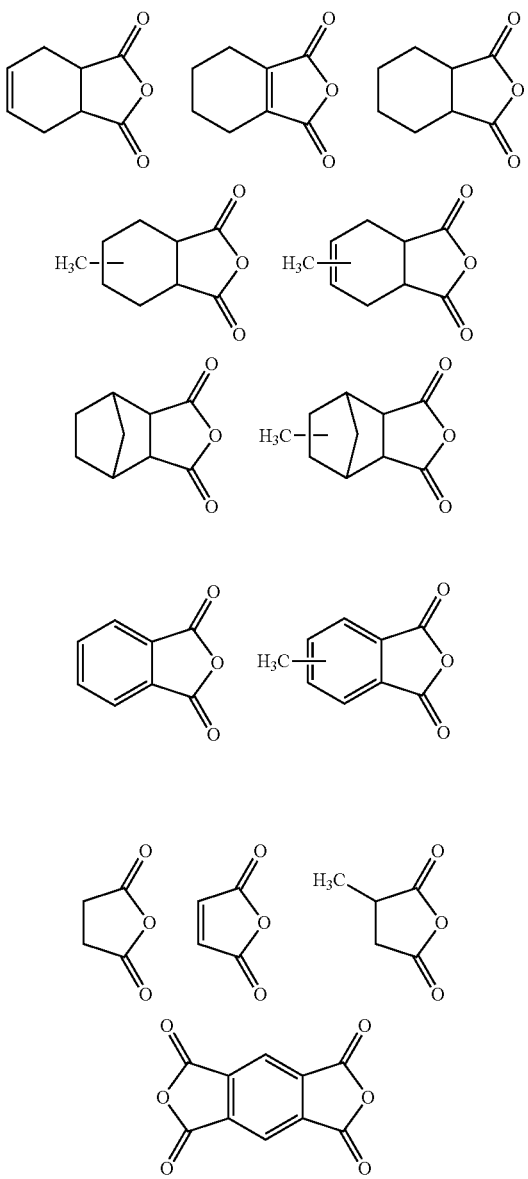

Among these, as the raw material compound (c) to be used in the present invention, a compound represented by the following formula is preferable.

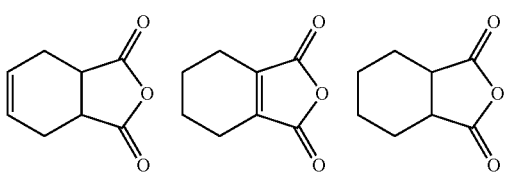

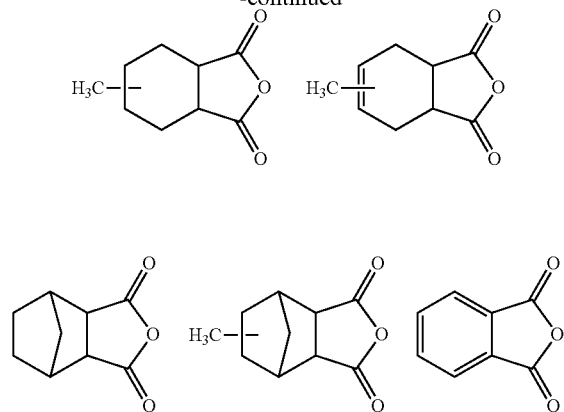

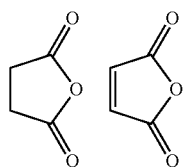

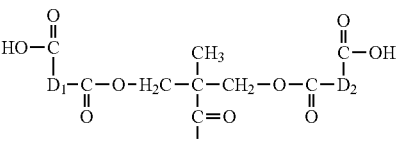

(5-1)

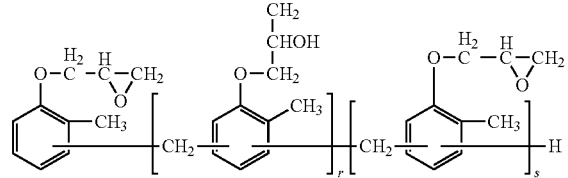

(wherein, in formula (5-1), r is an average of the number of repeating units in parentheses and represents a real number of 1 or more, s is an average of the number of repeating units in parentheses and represents a real number of 0 or more, provided that the sum of r and s is 30 or less, and D1 and D2 each independently represent any one of divalent bonding groups represented by formulas (6-1) to (6-10) below:

In the reaction between the intermediate (ab) and the raw material compound (c), it is preferable to use the raw material compound (c) in an amount of 0.1 to 1.0 mol, with respect to 1 mol of the hydroxyl group in the intermediate (ab). The reaction temperature is generally 60 to 150° C., and the reaction time is generally 3 to 24 hours.

In the reaction between the raw material compounds (a) and (b), and/or the reaction between the intermediate (ab) and the raw material compound (c), an organic solvent is preferably used as a diluent. Specific examples of the organic solvent include ketones such as ethyl methyl ketone, cyclohexanone, and cyclopentanone, aromatic hydrocarbons such as toluene, xylene, and tetramethylbenzene, glycol ethers such as dipropylene glycol dimethyl ether and dipropylene glycol diethyl ether, esters such as ethyl acetate, butyl acetate, butyl cellosolve acetate, and carbitol acetate, aliphatic hydrocarbons such as octane and decane, and petroleum solvents such as petroleum ether, petroleum naphtha, hydrogenation petroleum naphtha, and solvent naphtha.

Further, preferable embodiments include use of a catalyst such as triphenylphosphine, benzyldimethylamine, methyl triethyl ammonium chloride, triphenylstibine, and chromium octanoate, for promoting the reaction. When a catalyst is used, the used catalyst is preferably made substantially inactive after the completion of the reaction by oxidation treatment using organic peroxides or the like. The amount of the catalyst to be used is preferably 0.1 to 10 mass % with respect to the mixture of reaction raw materials.

Further, in order to prevent polymerization during the reaction, it is also preferable to use a polymerization inhibitor such as hydroquinone, methyl hydroquinone, p-methoxyphenol, catechol, and pyrogallol in combination, and the amount thereof to be used is preferably 0.01 to 1 mass % with respect to the mixture of reaction raw materials.

It is preferable that the component (B) thus obtained be an epoxy compound represented by formula (5-1) below:

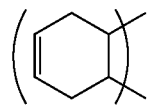 (6-1)

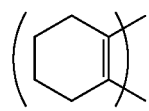 (6-2)

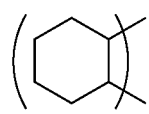 (6-3)

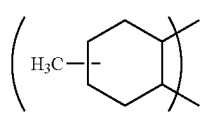 (6-4)

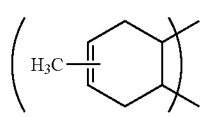 (6-5)

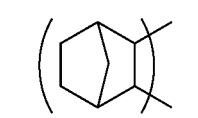 (6-6)

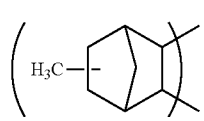 (6-7)

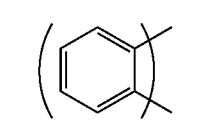 (6-8)

-continued

(6-9)

(6-10)

and
more preferably, D1 and D2 each are a divalent bonding group represented by formula (6-1) above.

Concerning the contents of the component (A) and the component (B) in the photosensitive resin composition of the present invention, the content of the component (A) is generally 1 part by mass to 60 parts by mass, preferably 2 parts by mass to 30 parts by mass, with respect to 100 parts by mass of the component (B). In the case where the content of the component (A) with respect to 100 parts by mass of the component (B) is less than 1 part by mass, the reaction may be insufficient in some cases, whereas in the case where it is over 60 parts by mass, the cost of the photosensitive resin composition increases, in addition to the fact that the component (A) itself may possibly significantly affect the solubility of the component (A).

In the photosensitive resin composition of the present invention, (C) a base proliferator (hereinafter, which may be simply referred to also as "component (C)") can be used in combination. The component (C) is a compound capable of generating a large amount of base by the total amount thereof eventually decomposing in a self-propagating manner due to the action of a very small amount of base released from the component (A) by irradiation with active energy rays.

The component (C) which can be used in combination is not specifically limited as long as it is a compound capable of generating base by decomposing due to the action of the base released from the component (A), but is preferably an urethane compound containing at least one urethane bond in its structure. The urethane compound is characterized by decomposing due to the action of base (ammonia or amine) derived from the amino group of the component (A) and generating base (ammonia or amine) derived from the urethane bond.

More preferably, the component (C) which can be used in combination in the photosensitive resin composition of the present invention is a compound having a base proliferating group represented by general formula (7-1) below.

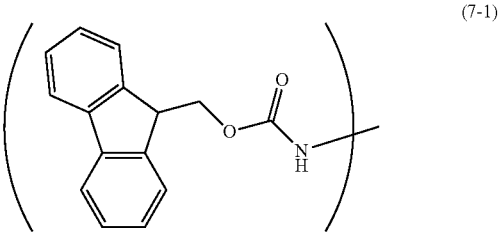
(7-1)

Specific examples of the component (C) having a base proliferating group represented by formula (7-1) above are shown in formulas (9-1) to (9-6) below, but there is no limitation to these.

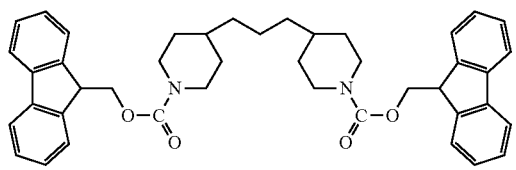
(9-1)

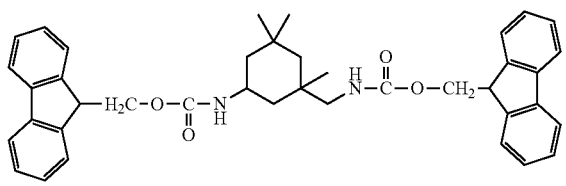
(9-2)

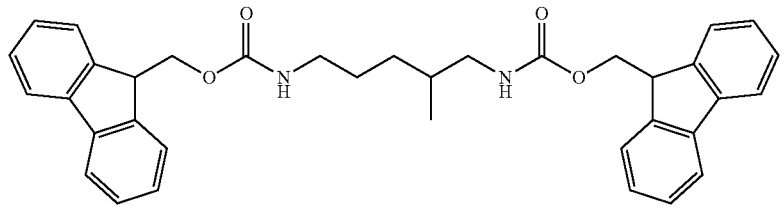
(9-3)

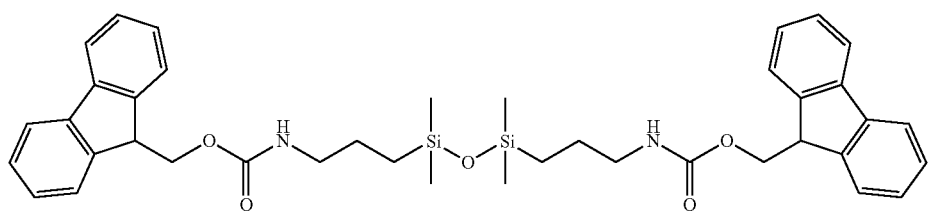
(9-4)

-continued (9-5)

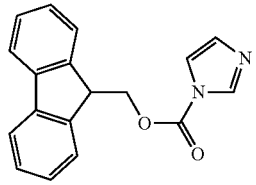

(9-6)

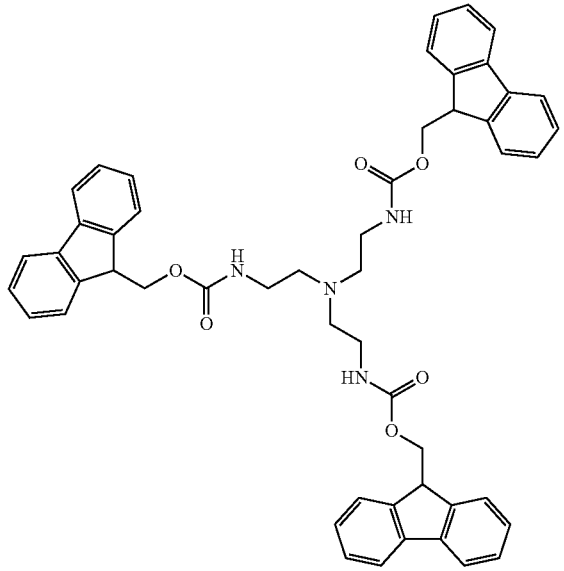

Only one of these examples of the component (C) may be used, or two or more of them may be mixed and used.

The content of the component (C) in the photosensitive resin composition of the present invention is generally 60 parts by mass or less, preferably 1 to 30 parts by mass, with respect to 100 parts by mass of the component (B). By adding 1 part by mass or more of the component (C), the component (B) can be rapidly reacted. Meanwhile, when the content is 60 parts by mass or less, preferably 30 parts by mass or less, the component (C) itself does not significantly affect the solubility of the component (B), and the cost of the photosensitive resin composition can be reduced.

In the photosensitive resin composition of the present invention, one or a plurality of additives such as a solvent, a reactive epoxy monomer, a photosensitizer, an inorganic filler, a coloring agent, a polymerization inhibitor, a thickener, a defoamer, an adhesion imparting agent, a leveling agent, and a photo-radical initiator can be used in combination, as needed. When such an additive is used, the amount of the additive added is preferably 0.01 to 20 parts by mass in total with respect to 100 parts of the component (A).

A photosensitive resin composition solution can be prepared by dissolving the photosensitive resin composition of the present invention in an organic solvent. The organic solvent which can be used in combination is not particularly limited, but examples thereof include ethers including diethyl ether, tetrahydrofuran, and dioxane; glycol monoethers (so-called cellosolves) including ethylene glycol monomethyl ether, ethylene glycol monoethyl ether, and diethylene glycol monoethyl ether; ketones including methyl ethyl ketone, acetone, methyl isobutyl ketone, cyclopentanone, and cyclohexanone; esters including ethyl acetate, butyl acetate, n-propyl acetate, i-propyl acetate, and propylene glycol monomethyl ether acetate; alcohols including methanol, ethanol, isopropanol, butanol, cyclohexanol, ethylene glycol, and glycerin; hydrocarbon halides including methylene chloride, chloroform,1,1-dichloroethane, 1,2-dichloroethane, 1-chloropropane, and chlorobenzene; amides including N,N-dimethylformamide, N,N-dimethylacetamide, and N-methylpyrrolidone; lactones including γ-butyrolactone; sulfoxides including dimethylsulfoxide; chain or cyclic saturated hydrocarbons including hexane, cyclohexane, and heptane; and other organic polar solvents. Further, examples of the organic solvents include aromatic hydrocarbons including benzene, toluene, and xylene; and other organic nonpolar solvents. One of these organic solvents is used alone, or two or more of them are used in combination. Among these, amides, lactones, sulfoxides, esters, ketones, and alcohols are preferable, since the solubility of the component (A) tends to be good.

In the photosensitive resin composition of the present invention, a reactive epoxy monomer may be used in combination, in order to improve the pattern performance, the resist reactivity, the properties of a cured film, or the like. In this description, the reactive epoxy monomer means a compound which is liquid or semi-solid at room temperature, has a weight-average molecular weight of about 1000 or less, and has an epoxy group, and specific examples thereof include diethylene glycol diglycidyl ether, hexanediol diglycidyl ether, dimethylolpropane diglycidyl ether, polypropylene glycol diglycidyl ether (ED506, manufactured by ADEKA CORPORATION), trimethylolpropane triglycidyl ether (ED505, manufactured by ADEKA CORPORATION), trimethylolpropane triglycidyl ether (low-chlorine type, EX321L, manufactured by Nagase ChemteX Corporation), pentaerythritol tetraglycidyl ether, bisphenol A diglycidyl ether, bisphenol F diglycidyl ether, and 3,4-epoxycyclohexenylmethyl-3',4'-epoxycyclohexene carboxylate (CELLOXIDE 2021P, manufactured by DAICEL CHEMICAL INDUSTRIES, LTD.). One of these can be used alone, or two or more of them can be mixed and used. In the case where the reactive epoxy monomer is liquid, and the content thereof exceeds 20 mass % with respect to the total amount of the resin composition, stickiness occurs in the film after the solvent is removed, and mask sticking tends to occur, which are inappropriate. In view of this, the proportion of the reactive epoxy monomer in the resin composition of the present invention is preferably 20 mass % or less in the photosensitive resin composition.

As the photosensitizer which can be used in combination, thioxanthones and anthracene compounds having an alkoxy group at the 9-position and 10-position (9,10-dialkoxyanthracene derivatives) are preferable. Examples of the alkoxy group include C1 to C4 alkoxy groups such as a methoxy group, an ethoxy group, a propoxy group, and a butoxy group. 9,10-dialkoxyanthracene derivatives may further have a substituent. Examples of the substituent include halogen atoms such as a fluorine atom, a chlorine atom, a bromine atom, and an iodine atom, alkyl groups having 1 to 4 carbon atoms such as a methyl group, an ethyl group, and a propyl group, sulfonic acid alkyl ester groups, and carboxylic acid alkyl ester groups. Examples of the alkyl in the sulfonic acid alkyl ester groups and the carboxylic acid alkyl esters include an alkyl having 1 to 4 carbon atoms such as methyl, ethyl, and propyl. These substituents are preferably located at the 2-position.

Examples of the inorganic filler which can be used in combination include known inorganic fillers such as barium sulfate, barium titanate, silicon oxide powder, finely powdered silicon oxide, amorphous silica, talc, clay, magnesium carbonate, aluminum oxide, aluminum hydroxide, and mica, and the inorganic filler is used for the purpose of improving various properties such as the adhesion between a cured product and a substrate and the hardness of the cured product.

Examples of the coloring agent which can be used in combination include phthalocyanine-blue, phthalocyanine-green, iodin-green, disazo yellow, crystal violet, titanium oxide, carbon black, and naphthalene black.

Examples of the polymerization inhibitor which can be used in combination include hydroquinone, hydroquinone monomethyl ether, t-butylcatechol, pyrogallol, and phethiazine.

Examples of the thickener which can be used in combination include, asbestos, Orben, Bentone, and montmorillonite.

Examples of the defoamer which can be used in combination include silicone-based, fluorine-based, and polymer-based defoamers.

As the adhesion imparting agent which can be used in combination, coupling agents such as silane coupling agents or titanium coupling agents can be used, and the silane coupling agents are preferable.

The substrate using the photosensitive resin composition is not particularly limited, and specific examples thereof include polyester substrates such as polyethylene terephthalate, polybutylene terephthalate, polytetramethylene terephthalate, and polyethylene naphthalate, polyimide substrates such as condensation polyimides, addition polyimides, and high-temperature addition polyimides, epoxy resin substrates such as BA epoxy resins, BF epoxy resins, and phenoxy resins, phenol resin substrates such as phenol novolac resins, cresol novolac resins, and polyhydroxystyrene, polyolefin substrates such as polyethylene, polypropylene, polystyrene, and polycycloolefin, polyamide substrates such as nylon 6,6, nylon 6, nylon 6,T, nylon 4,6, nylon 12, and nylon 6,12, and further polyurethane-based, polycarbonate-based, polyacetal-based, polyphenylene ether-based, poly(meth)acrylate-based, acrylonitrile-butadiene-styrene copolymer-based, polyphenylene sulfide-based, polyetheretherketone-based, polyetherimide-based, polyethersulfone-based, and polybenzoxazole-based substrates, resin substrates reinforced by glass fibers or the like, and metal-based substrates such as Si, Cu, Ag, Au, Ni, Pd, Co, Rh, Fe, In, and Sn. When the photosensitive resin composition of this embodiment is formed as a film on a substrate, a sintering process at high temperature is not essential. Therefore, there is no limitation on the heat resistance or the like of the substrate. Accordingly, various resins as described above can be used as a substrate.

The form of the substrate using the photosensitive resin composition is not particularly limited, and specific examples thereof include films, sheets, tapes, fine particles, laminate plates, three dimensional molded products, and printed circuit boards, films, and tapes, on which a metal such as Cu, Ag, Au, Ni, Pd, Co, Rh, Fe, In, and Sn is patterned.

A method for applying the photosensitive resin composition of the present invention onto the substrate is not particularly limited, and specific examples thereof include known methods such as ink jetting, spray coating, spin coating, roll coating, electrostatic coating, curtain coating, flexo printing, gravure printing, offset printing, gravure offset printing, and screen printing. Among these, flexo printing and gravure printing are preferable. The photosensitive resin composition is applied onto the substrate by such a printing method, so that a protective film having a suitable film thickness for patterning can be formed with high positional accuracy.

According to another aspect of the present invention, an electronic component including a substrate obtained by the production method according to the aforementioned aspect of the present invention is provided. The patterned substrate obtained by the aforementioned method is advantageous, for example, in that a fine pattern can be formed as compared with a substrate patterned by screen printing, and it is convenient since man hours can be reduced as compared with a substrate using a non-photosensitive insulating material. Such a substrate can be suitably used as an electronic component of a flexible wiring board, an IC tag antenna circuit board, or the like. More specifically, it can be used for applications such as an antenna circuit of RFID IC tags, a circuit of flexible, rigid, rigid flex, and other printed circuit boards, a fine wiring for shielding electromagnetic waves, a semiconductor wiring, a transistor wiring, a capacitor wiring, a resistor wiring, a wiring and an electrode in batteries, a wiring and an electrode in organic EL displays, a wiring and an electrode in inorganic EL displays, a wiring and an electrode in digital signages, a wiring and an electrode in electronic papers, a wiring and an electrode in liquid crystal displays, a wiring and an electrode in plasma displays, and a wiring and an electrode in surface emitting lights such as organic EL.

The pattern forming method of the present invention is characterized by using a photosensitive resin composition containing the component (A) and the component (B), and further the component (C), as needed. For example, a coating solution is produced by dissolving the photosensitive resin composition of the present invention in an organic solvent, and the coating solution is applied onto a support such as a substrate, followed by drying, to form a coating film. Then, this coating film is subjected to pattern exposure to generate base. Subsequently, the coating film is subjected to heat treatment so as to allow the reaction of a base reactive resin to proceed. After the completion of the reaction, a cured resin pattern having a predetermined shape is obtained by immersing the coating film in a solvent (developer) having a difference in solubility between exposed portions and unexposed portions to develop the film.

The conditions of the heat treatment are appropriately set depending on the exposure energy, the type of the photobase generator used, and the alkali-soluble epoxy compound. The heating temperature is generally 50 to 250° C., preferably 60 to 130° C. The heating time is preferably 10 seconds to 60 minutes, more preferably 60 seconds to 30 minutes.

EXAMPLES

Hereinafter, the present invention will be described in detail by way of examples, but these examples are merely shown for suitably illustrating the present invention, and the present invention is not limited to these examples at all. It should be noted that the term, part(s), in Synthesis Examples and Examples means part(s) by mass.

Synthesis Example 1 (Synthesis of
4,5-dimethoxy-2-nitrobenzyl Alcohol 12.5 parts of 4,5-dimethoxy-2-nitro benzyl aldehyde, 1.5 parts of sodium tetrahydroborate, and 250 parts of methanol were put into a flask equipped with a stirrer, a reflux condenser, and a stirring device, followed by stirring at room temperature (23° C.) for 3 hours, and thereafter 38 parts of a saturated ammonium chloride solution was added thereto. Then, a precipitated yellow solid was filtered and collected, and 120 parts of chloroform was added to the filtrate for extraction operation. Thereafter, the solvent was distilled off to obtain a gray solid. The obtained solid was recrystallized with ethyl acetate, to obtain 8.4 parts of a yellow solid of 4,5-dimethoxy-2-nitrobenzyl alcohol.

Synthesis Example 2 (Synthesis of Photobase
Generator A-1 (Compound Represented by Formula
(8-3) Above))

8.9 parts of 4,5-dimethoxy-2-nitrobenzyl alcohol obtained in Synthesis Example 1, 150 parts of toluene, and 0.02 part of tin octylate were put into the flask, followed by reflux and stirring to uniformity. Subsequently, 4.6 parts of isophorone diisocyanate was added thereto under reflux, and the reflux was continued for 3 hours, followed by cooling, to distill off the solvent using an evaporator. The obtained brown solid was recrystallized with ethanol, to obtain 6.8 parts of photobase generator A-1.

Synthesis Example 3 (Synthesis of
2-nitro-4,5-dimethoxybenzyl 4'-nitrophenyl
Carbonate 13.0 parts of 4,5-dimethoxy-2-nitrobenzyl alcohol obtained in Synthesis Example 1, 12.3 parts of triethylamine, and 60 parts of THF were put into the flask, followed by stirring to uniformity, and thereafter 55 parts of a THF solution of p-nitrophenyl chloroformate was added dropwise thereto over 20 minutes. After the completion of the dropwise addition, the mixture was stirred at room temperature for 3 hours, and the reaction solution was put into water, followed by extraction with dichloromethane. The organic layer was washed sequentially with a 5 mass % HCl aqueous solution, a saturated sodium hydrogen carbonate aqueous solution, and saturated saline, and thereafter the organic layer was dried with anhydrous magnesium sulfate, to distill off the solvent using an evaporator. The obtained solid was recrystallized with toluene, followed by drying under reduced pressure, to obtain 17.6 parts of a yellow solid of 2-nitro-4,5-dimethoxybenzyl 4'-nitrophenyl carbonate.

Synthesis Example 4 (Synthesis of Photobase
Generator A-2 (Compound Represented by Formula
(8-4) Above))

1.0 part of 2-nitro-4,5-dimethoxybenzyl 4'-nitrophenyl carbonate obtained in Synthesis Example 3, 0.13 part of 1-hydroxy triazole, and 60 ml of dichloromethane were put into the flask, 20 ml of a dichloromethane solution of 1,3-di-4-piperidyl propane was added dropwise thereto over 30 minutes under reflux, followed by reflux and stirring for 4 hours. After the completion of the reaction, the mixture was sequentially washed with a saturated sodium hydrogen carbonate aqueous solution and saturated saline, followed by extraction of the organic layer and drying over anhydrous magnesium sulfate, and thereafter the solvent was distilled off using an evaporator, to obtain a yellow solid. After stirring the obtained solid in excess methanol, followed by filtration, the obtained solid was recrystallized with 2-propanol, to obtain 0.25 part of a yellow solid of photobase generator A-2.

Synthesis Example 5 (Synthesis of Alkali-soluble
Epoxy Compound B-1)

According to the description "Synthesis Example of alkali-soluble epoxy compound" in paragraph [0058] of Japanese Patent No. 4,913,143, an alkali-soluble epoxy compound (B-1) was synthesized. It should be noted that alkali-soluble epoxy compound B-1 is a compound represented by formula (5-1), wherein both D1 and D2 are represented by formula (6-1).

Synthesis Example 6 (Synthesis of Base
Proliferator C (Compound Represented by Formula
(9-4) Above))

10.0 parts of chloroformic acid 9-fluorenylmethyl and THF were put into the flask, followed by stirring to uniformity. This solution was cooled to 2° C. in an ice bath, and thereafter 35 parts of a THF solution in which 9.6 parts of 1,3-bis(3-aminopropyl) tetramethyldisiloxane was dissolved was added dropwise thereto over 20 minutes under cooling, followed by stirring for 3 hours. 60 parts of chloroform was added to the obtained solution, and the mixture was sequentially washed with a 5 mass % HCl aqueous solution, a saturated sodium hydrogen carbonate aqueous solution, and saturated saline, followed by extraction of the organic layer and drying over magnesium sulfate. Thereafter, the solvent was distilled off using an evaporator to obtain a white solid. The obtained solid was recrystallized with ethanol, to obtain 10 parts of a white solid of the base proliferator C which is a compound represented by formula 9-4 above.

Examples 1 to 4 and Comparative Examples 5 to 8

(Preparation of Photosensitive Resin Compositions)
The respective components were mixed according to the amounts shown in Table 1, to obtain photosensitive resin compositions.

TABLE 1

|  | Component | Example 1 | Example 2 | Example 3 | Example 4 | Comparative Example 5 | Comparative Example 6 | Comparative Example 7 | Comparative Example 8 |
|---|---|---|---|---|---|---|---|---|---|
| Photobase generator | A-1 | 15 | 10 | 10 | 5 | 15 | 10 |  | 15 |
|  | A-2 |  |  |  |  |  |  | 13 |  |
| Epoxy resin | B-1 | 100 | 100 | 100 | 100 |  |  |  |  |
|  | B-2 |  |  |  |  | 100 | 100 | 100 |  |
|  | B-3 |  |  |  |  |  |  |  | 100 |
|  | B-4 |  |  |  |  | 44 | 44 | 44 |  |
|  | B-5 |  |  |  |  | 44 | 44 | 44 |  |
| Base proliferator | C |  | 25 |  | 5 |  | 25 | 25 |  |
| Epoxy monomer | D-1 |  |  |  |  | 8 | 8 | 8 |  |
| Silane coupling agent | E | 2 | 2 | 2 | 2 | 4 | 4 | 4 | 2 |
| Leveling agent | F | 0.2 | 0.2 | 0.2 | 0.2 | 0.2 | 0.2 | 0.2 | 0.2 |
| Solvent | G | 125 | 125 | 125 | 125 | 200 | 200 | 200 | 125 |
| Solid content mass % | — | 49 | 53 | 49 | 49 | 54 | 58 | 61 | 49 |

(A-1): Photobase generator obtained in Synthesis Example 2
(A-2): Photobase generator obtained in Synthesis Example 4
(B-1): Alkali-soluble epoxy compound obtained in Synthesis Example 5
(B-2): SU-8 (bisphenol A novolac epoxy compound, manufactured by Nippon Kayaku Co., Ltd.)
(B-3): EOCN-4400H (o-cresol novolac epoxy compound, manufactured by Nippon Kayaku Co., Ltd.)
(B-4): NER-7604 (bisphenol F epoxy compound, manufactured by Nippon Kayaku Co., Ltd.)
(B-5): EHPE-3150 (alicyclic epoxy compound, manufactured by Daicel Corporation)
(C): Base proliferator obtained in Synthesis Example 6 (compound represented by formula (9-4) above)
(D-1): ED-506 (manufactured by ADEKA CORPORATION)
(E): S-510 (manufactured by Chisso Corporation)
(F): MEGAFAC F-470 (manufactured by DIC Corporation)
(G): Cyclopentanone Patterning of Photosensitive Resin Compositions The resin composition of each of Examples 1 to 4 and Comparative Examples 5 to 8 was applied onto a Si substrate with a spin coater, and thereafter it was pre-baked to dryness using a hot plate at 100° C. for 2 minutes, to obtain a resin composition layer having a film thickness of 10 μm. Thereafter, pattern exposure (soft contact and broad band exposure) was performed using an i line exposure apparatus (mask aligner, manufactured by USHIO INC.), so that irradiation with UV light of 900 to 3000 mJ/cm² was performed. Next, after the baking using a hot plate, development was performed by an immersion method using a developer, to obtain a cured resin pattern on the substrate. Table 2 shows the heating temperature after exposure, the heating time, the development solvent, and the development time.

TABLE 2

|  | Example 1 | Example 2 | Example 3 | Example 4 | Comparative Example 5 | Comparative Example 6 | Comparative Example 7 | Comparative Example 8 |
|---|---|---|---|---|---|---|---|---|
| Heating temperature | 110° C. | 110° C. | 110° C. | 110° C., 130° C. | 130° C. | 120° C. | 120° C. | 110° C. |
| Heating time | 10 minutes | 10 minutes | 10 minutes | 15 minutes, 5 minutes | 15 minutes | 15 minutes | 5 minutes | 10 minutes |
| Developer | 6% TMAH aq. | 2.38% TMAH aq. | PGMEA | PGMEA | PGMEA | PGMEA | PGMEA | PGMEA |
| Development time | 4 minutes 30 seconds | 5 minutes | 3 minutes | 3 minutes | 2 minutes | 2 minutes | 5 minutes | 5 minutes |

Evaluation of Residual Film Ratio of Photosensitive Resin Compositions

The film thickness of the patterns obtained above in "Patterning of photosensitive resin compositions" was measured using a stylus-type film thickness meter. FIG. 1 and FIG. 2 show the residual film ratio with each exposure amount (the film thickness of the patterns obtained after patterning, when the film thickness before the exposure is taken as 1). The residual film ratio in Examples 1 to 4 was about 1, and the film thickness before the exposure was almost maintained, whereas the residual film ratio in Comparative Examples was significantly low. Thus, it turned out that the photosensitive resin compositions of Examples were exceptionally excellent among the system using a photobase generator.

Evaluation of Resolution of Photosensitive Resin Compositions

The line width of the patterns obtained above in "Patterning of photosensitive resin compositions" was measured. FIG. 3 and FIG. 4 show the resolution with each exposure amount (the narrowest line width of the pattern in close contact with the substrate). It should be noted that the resolution was evaluated as 0 for those in which the patterns have flowed away by development and did not remain on the substrate. As seen from FIG. 3 and FIG. 4, it turned out that the resolution was high when the compositions of Examples were used, as compared with the case where the compositions of Comparative Examples were used.

The photosensitive resin composition of the present invention is capable of alkali development and has excellent image resolution, excellent sensitivity, and excellent storage stability, and further the cured product of the resin composition has excellent properties of thermostability. Thus, the photosensitive resin composition of the present invention is useful in fields where the corrosion resistance of metal substrates is required.

The invention claimed is:

1. A photosensitive resin composition comprising:
(A) a photobase generator; and
(B) an alkali-soluble epoxy compound, wherein
the photobase generator (A) comprises a compound represented by formula (2-1) below:

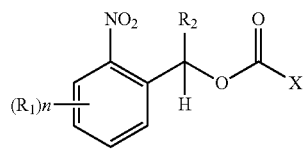
(2-1)

wherein, in formula (2-1), n represents an integer of 1 to 2;
$R_1$ represents at least one substituent selected from the group consisting of an alkyl group having 1 to 18 carbon atoms, an alkenyl group having 2 to 18 carbon atoms, an alkynyl group having 2 to 18 carbon atoms, an aryl group having 6 to 12 carbon atoms, an acyl group having 1 to 18 carbon atoms, an aroyl group having 7 to 18 carbon atoms, a nitro group, a cyano group, an alkoxy group having 1 to 18 carbon atoms, an alkylthio group having 1 to 18 carbon atoms, and a halogen atom;
$R_2$ represents a hydrogen atom, an alkyl group having 1 to 18 carbon atoms, an alkynyl group having 2 to 18 carbon atoms, an aryl group having 6 to 12 carbon atoms, an acyl group having 1 to 18 carbon atoms, an aroyl group having 7 to 18 carbon atoms, a nitro group, a cyano group, an alkoxy group having 1 to 18 carbon atoms, an alkylthio group having 1 to 18 carbon atoms, a hydroxyl group, or a halogen atom; and
X is a group represented by formula (3-1) below:

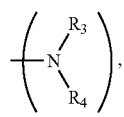
(3-1)

in which $R_3$ and $R_4$ each independently represent a hydrogen atom, an alkyl group having 1 to 12 carbon atoms, a cycloalkyl group having 5 to 10 carbon atoms, an aryl group having 6 to 14 carbon atoms, or an arylalkyl group having 7 to 15 carbon atoms, and
the alkali-soluble epoxy compound (B) is an epoxy compound obtained by allowing (c) a polybasic acid anhydride to react with a reaction product of (a) an epoxy compound having at least two epoxy groups in one molecule and (b) a compound having at least one hydroxyl group and one carboxyl group in one molecule.

2. The photosensitive resin composition according to claim 1, wherein the alkali-soluble epoxy compound (B) comprises an epoxy compound represented by formula (5-1):

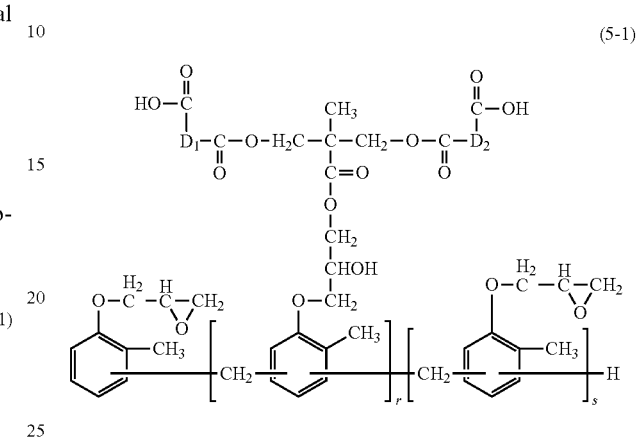
(5-1)

wherein, in formula (5-1), r represents a real number of 1 or more, s represents a real number of 0 or more, provided that the sum of r and s is 30 or less, and D1 and D2 each independently represent any one of divalent bonding groups represented by formulas (6-1) to (6-10) below:

(6-1)

(6-2)

(6-3)

(6-4)

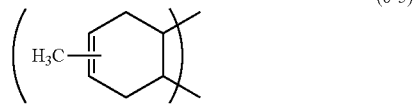
(6-5)

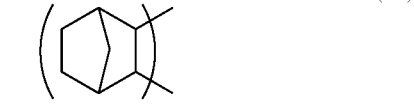
(6-6)

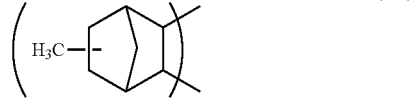
(6-7)

(6-8) 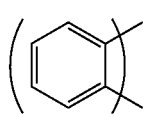

(6-9) 

(6-10) 

3. The photosensitive resin composition according to claim 1, further comprising a compound having at least one urethane bond as (C) a base proliferator.

4. The photosensitive resin composition according to claim 3, wherein the compound having at least one urethane bond is a compound having a base proliferating group represented by formula (7-1) below:

(7-1) 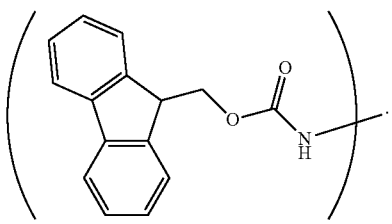

5. A cured product of the photosensitive resin composition according claim 1.

6. A method for forming a pattern, comprising:
applying the photosensitive resin composition according to claim 1 onto a support;
drying a photosensitive resin composition layer obtained by the application;
exposing the resin composition layer to light in a predetermined pattern after the drying;
baking the resin composition layer after the exposure;
developing the resin composition layer; and
heat-treating the obtained resin pattern to obtain a cured resin pattern.

7. A photosensitive resin composition comprising:
(A) a photobase generator; and
(B) an alkali-soluble epoxy compound, wherein
the photobase generator (A) comprises a compound represented by formula (4-1) below:

(4-1) 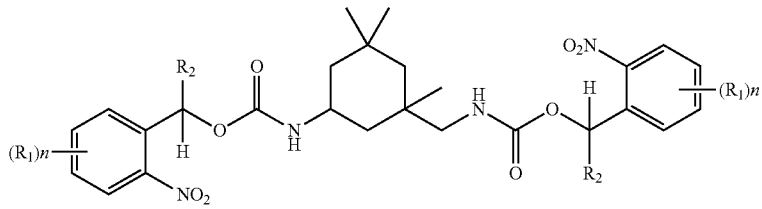

wherein, $R_1$ represents at least one substituent selected from the group consisting of an alkyl group having 1 to 18 carbon atoms, an alkenyl group having 2 to 18 carbon atoms, an alkynyl group having 2 to 18 carbon atoms, an aryl group having 6 to 12 carbon atoms, an acyl group having 1 to 18 carbon atoms, an aroyl group having 7 to 18 carbon atoms, a nitro group, a cyano group, an alkoxy group having 1 to 18 carbon atoms, an alkylthio group having 1 to 18 carbon atoms, and a halogen atom, $R_2$ represents a hydrogen atom, an alkyl group having 1 to 18 carbon atoms, an alkynyl group having 2 to 18 carbon atoms, an aryl group having 6 to 12 carbon atoms, an acyl group having 1 to 18 carbon atoms, an aroyl group having 7 to 18 carbon atoms, a nitro group, a cyano group, an alkoxy group having 1 to 18 carbon atoms, an alkylthio group having 1 to 18 carbon atoms, a hydroxyl group, or a halogen atom, n independently represents an integer of 0 to 4, and p represents an integer of 1 to 6.

* * * * *